United States Patent [19]

Kim

[11] Patent Number: 5,434,820
[45] Date of Patent: Jul. 18, 1995

[54] BACK BIAS VOLTAGE GENERATOR CIRCUIT OF A SEMICONDUCTOR MEMORY DEVICE

[75] Inventor: Tae-hoon Kim, Seoul, Rep. of Korea

[73] Assignee: Goldstar Electron Co., Ltd., Cheongju, Rep. of Korea

[21] Appl. No.: 134,040

[22] Filed: Oct. 8, 1993

[30] Foreign Application Priority Data

Oct. 8, 1992 [KR] Rep. of Korea .................. 1992 19241

[51] Int. Cl.6 .............................................. H03K 3/01
[52] U.S. Cl. ............................... 365/189.09; 365/226; 327/535; 327/536
[58] Field of Search ........................... 365/189.09, 226; 307/296.1, 296.2, 296.6, 296.8; 365/230.03; 327/535, 536, 537

[56] References Cited

U.S. PATENT DOCUMENTS

| | | | |
|---|---|---|---|
| 4,964,082 | 10/1990 | Sato et al. | 365/189.09 |
| 5,022,005 | 6/1991 | Tohnishi | 307/296.2 |
| 5,043,597 | 8/1991 | Furuyama et al. | 307/296.2 |

Primary Examiner—Joseph A. Popek
Assistant Examiner—Vu Le
Attorney, Agent, or Firm—Alan R. Loudermilk

[57] ABSTRACT

A Vbb generator having several distributed Vbb generators, which are located respectively adjacent to memory array blocks is disclosed. The distributed Vbb generator is activated during the time when a memory block located adjacent the Vbb generator is accessed for write/read operations. The back bias voltage generator circuit has a first Vbb generator and a second Vbb generator for supplying a back bias voltage to the substrate. The second Vbb generator comprises an oscillator for generating a clock pulse and a plurality of distributed Vbb generators. The distributed Vbb generators include an auxiliary pumping portion including a buffer portion for buffering the clock pulse from the oscillator, a pumping capacitor connected to the output of the buffer portion for pumping a back bias voltage, and a rectifying portion connected to the pumping capacitor for supplying the back bias voltage to the substrate, and a switch for connecting the clock pulse from the oscillator to the auxiliary pumping portion, the clock pulse activating a pumping operation of the auxiliary pumping portion.

14 Claims, 3 Drawing Sheets

BACK BIAS VOLTAGE GENERATOR CIRCUIT OF A SEMICONDUCTOR MEMORY DEVICE

FIELD OF THE INVENTION

The present invention relates to a back bias voltage generator circuit of a semiconductor memory device, and more particularly to a back bias voltage generator circuit of a semiconductor memory device in which a back bias voltage generator is positioned near memory cell blocks and operated while the cell array blocks are activated, thereby preventing fluctuation of the back bias voltage and improving the reliability of operation.

BACKGROUND OF THE INVENTION

Generally, a semiconductor memory device has a back (substrate) bias voltage (Vbb) generator for applying the back bias voltage to the substrate of the semiconductor memory device. Such a technology is disclosed in U.S. Pat. No. 4,775,959 which is incorporated herein by reference.

In U.S. Pat. No., 4,775,959, a back bias voltage (hereinafter referred to as "Vbb") generator circuit in a semiconductor memory device uses a/RAS1 signal, which is delayed by a timing control circuit TC from a row address strobe signal /RAS, and is activated by an input signal of a voltage level detection circuit (hereinafter referred to as the "VLD" section) and the /RAS1 signal.

Timing control circuit TC, as shown in FIG. 1, receives the row address strobe signal /RAS, the column address strobe signal /CAS, and a write enable signal /WE that are supplied from external terminals, and generates various timing signals necessary for the memory operation, e.g., /RAS1.

Herein, the VLD section senses whether the base back bias voltage level exceeds a predetermined voltage level.

As illustrated in FIG. 2, the Vbb generator circuit includes first Vbb generator Vbb-G1 and second Vbb generator Vbb-G2. The VLD section has three NMOS diodes Q12–Q14 and two PMOS transistors Q10 and Q11 which are serially connected between Vcc and Vbb. A signal on node "A" passes to an invertor constituted with pMOSFET Q15 and nMOSFET Q16 and invertors IV0 and IV1 to an one input of NAND gate G1. The other input of the NAND gate G1 is connected to a terminal receiving the /RAS1 signal.

First Vbb generator Vbb-G1 of Vbb generator circuit Vbb-G comprises second oscillator OSC2, a buffer portion having invertors IV4 and IV5 for buffering a signal from second oscillator OSC2, pumping capacitor C2, and a rectifying portion having diodes Q20 and Q21, which are connected to pumping capacitor C2 and between ground GND and substrate Vbb.

The second Vbb generator Vbb-G2 comprises first oscillator OSC1 including three NAND Gates G2–G4, a buffer portion which comprises two invertors IV2 and IV3, which are series-connected to the output stage of first oscillator OSC1, and a rectifying portion with NMOS transistors Q18 and Q19 series connected through pumping capacitor Cl from the output stage of the buffer portion.

Herein, capacitor C1 as the pumping capacitor of second Vbb generator Vbb-G2 has a big capacitance and capacitor C2 of the first Vbb generator Vbb-G1 has a smaller capacitance than capacitor Cl.

FIG. 3 is a timing chart for explanation of an operation of Vbb generator circuit Vbb-G of FIG. 2.

With respect to the conventional semiconductor memory device as explained above, an operation of Vbb generator Vbb-G1 is explained. If power source Vcc is applied to Vbb generator Vbb-G1, an oscillation signal with a predetermined pulse rate subsequently is output from second oscillator OSC2. If the oscillating signal of second oscillator OSC2 is high, diode Q20 is turned-on so that one electrode of capacitor C2 as the pumping capacitor is connected to the ground and charges the ground level. If the oscillating signal of second oscillator OSC2 is low, diode Q20 is turned-off and diode Q21 is turned-on so that one electrode of capacitor C2 becomes a more negative voltage level than ground level. Thus, diode Q21 is turned-on and is connected electrically to Vbb, which is lowered in the negative direction. Such operation continues while the electric power source is applied thereto.

The driving power of first Vbb generator Vbb-G1 is weak to the extent that it compensates as much as the leakage current of the transistors in the chip when operating in a stand-by mode.

The main back bias voltage generator, second Vbb generator Vbb-G2, combined with the VLD section, has a relatively large driving capacity for generating a negative voltage.

If Vcc is applied to these portions, as PMOS transistor Q10 is turned-on and node "A" is "high", PMOS transistor Q15 is off and node "B" is "low" ; as the "low" signal is reversed by invertor IV0, node "C" is "high" ; and as it is again reversed in invertor IV1, node "D" as the output stage is "low", thereby being applied to one input of NAND Gate G1.

If the /RAS1 signal, which is delayed a little from the /RAS signal, is applied as "low", NAND gate G1 output node "E" is "high", so that first oscillator OSC1 operates and its oscillating signal is applied to capacitor C1 through the buffer portion, and thereby the negative voltage is applied to the substrate through node-Vbb by the operation of diodes Q18 and Q19 of the rectifying portion by pumping operation of capacitor Cl.

When the negative voltage is continuously applied, and thus the voltage level of Vbb goes below −3Vth as shown in FIG. 3, diodes Q12–Q14 of the VLD section are in a forward direction and turned-on, thereby PMOS transistor Q11 is on and therefore node "A" is "low", node "B" is "high", node "C" is "low" and node "D" is "high".

In this state, operation of first oscillator OSC1 is controlled by the /RAS1 signal. If the /RAS1 signal is "high", i.e., in a stand-by mode, then first oscillator OSC1 stops its operation, thereby stopping the pumping operation of capacitor Cl. If the /RAS1 signal is "low", i.e., in an active state, then first oscillator OSC1 continues negative pumping.

While the chip is in a stand-by mode, most transistors are off and the leakage current is relatively small due to operation of equalizer or pre-charge transistors. Therefore, in this status, consumption of electric power required for stand-by mode can be reduced by operating only first Vbb generator Vbb-G1, which has a small driving capacity.

Otherwise, if the chip is active or the voltage level of the Vbb does not reach below −3Vth, the chip is active by operation of second Vbb generator Vbb-G2 having a large driving capacity, and many transistors are operated, thereby preventing a rise of the Vbb voltage caused by a relatively large amount of leakage current, so that it is possible to realize safe operation of the chip.

In such kinds of conventional semiconductor memory devices, the Vbb generator should be increased according to an increase of the memory capacity. However, for the array block located farthest from the Vbb generator, the Vbb voltage of the farthest array block rises due to the delay in transmitting the Vbb voltage from the Vbb generator. In this regard, there occurs a problem of degrading the reliability of the semiconductor memory device, since operation errors of the array block might occur.

SUMMARY OF THE INVENTION

In order to solve the problem described above, in the present invention a Vbb generator is divided into several distributed Vbb generators which are located adjacent to each memory array block respectively, and the distributed Vbb generator is activated during the time when the memory block array located adjacent to the distributed Vbb generator is accessed for write /read operations.

An object of the present invention is to provide a back bias voltage generator circuit of a semiconductor memory device having a first Vbb generator and a second Vbb generator for supplying a back bias voltage to the substrate, wherein the second Vbb generator comprises an oscillator for generating a clock pulse; and a plurality of distributed Vbb generators, which are located adjacent to each memory cell array block, respectively, and receive the clock pulse, and are activated in accordance with cell array block selecting signals.

The distributed Vbb generator comprises an auxiliary pumping portion including a buffer portion for buffering the clock pulse from the oscillator, a pumping capacitor connected to the output stage of the buffer portion for pumping a back bias voltage, and a rectifying portion connected to the pumping capacitor for supplying the back bias voltage to a substrate; and a switching means for connecting the clock pulse from the oscillator to an auxiliary pumping portion, which clock pulse activates a pumping operation of the auxiliary pumping portion.

The distributed Vbb generators are located between memory cell array blocks, and may be beside row decoders, which are positioned respectively between memory cell array blocks.

As the memory capacity has increased when chip size is enlarged, and as the Vbb capacitance has increased, even though a cell array block which is far from where the conventional Vbb generator would be operating, it is possible to prevent a rise of the Vbb voltage by operation of only an adjacent distributed Vbb generator, thereby improving reliability. Further, a back bias voltage generator circuit according to the present invention can remarkably reduce the consumption of electric power by activating a distributed Vbb generator for supplying a Vbb voltage only in a necessary portion to prevent Vbb from rising therein.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENTS

Figure 1:
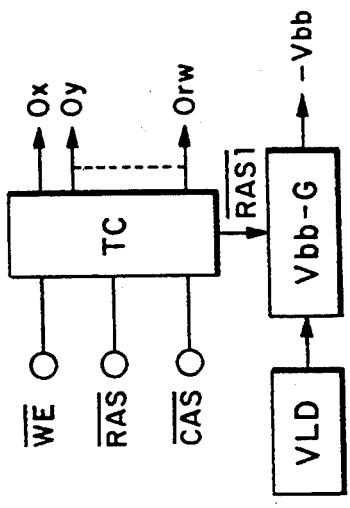
FIG. 1 is a block diagram of a back bias voltage generator circuit of a conventional semiconductor memory device.
Figure 2:
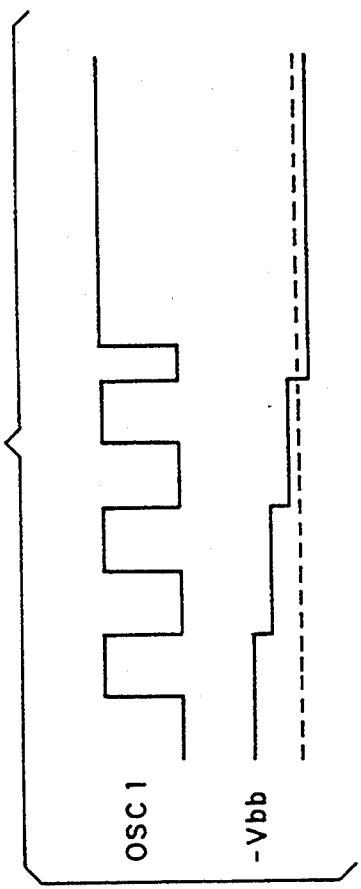
FIG. 2 is a diagram of a back bias voltage generator circuit of a conventional semiconductor memory device.
Figure 3:
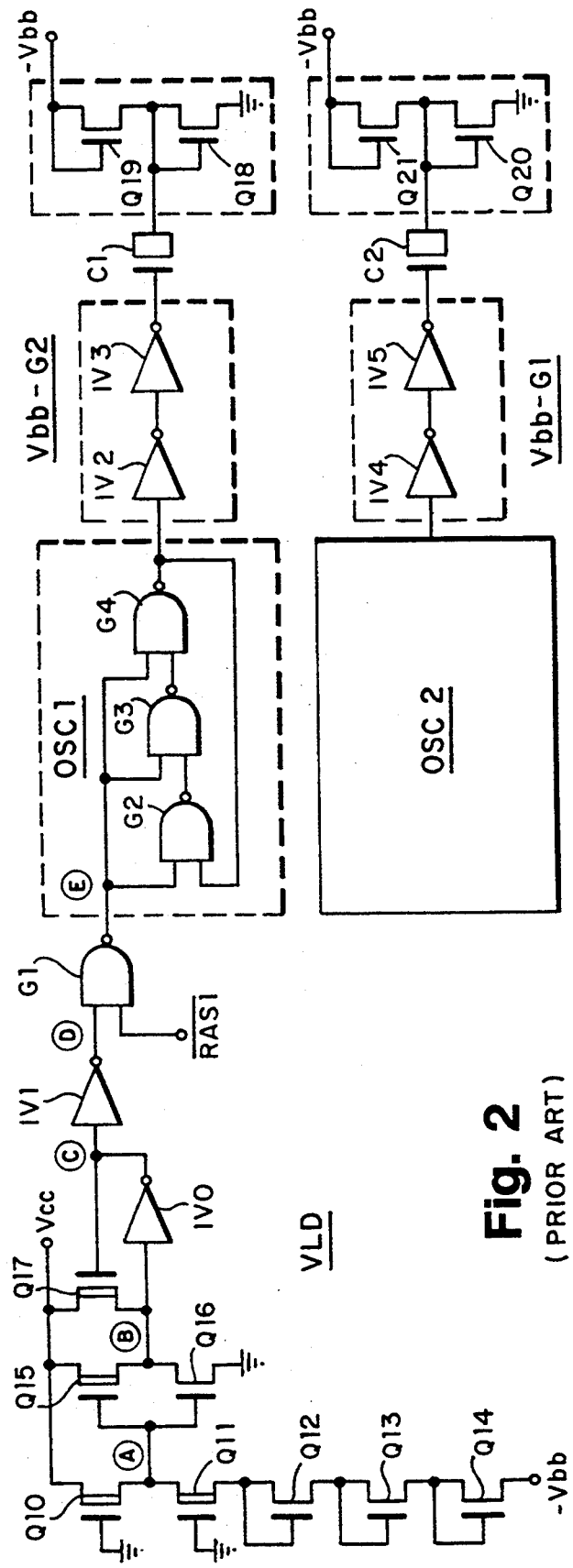
FIG. 3 is a diagram of the operation timing of the conventional back bias circuit.
Figure 4:
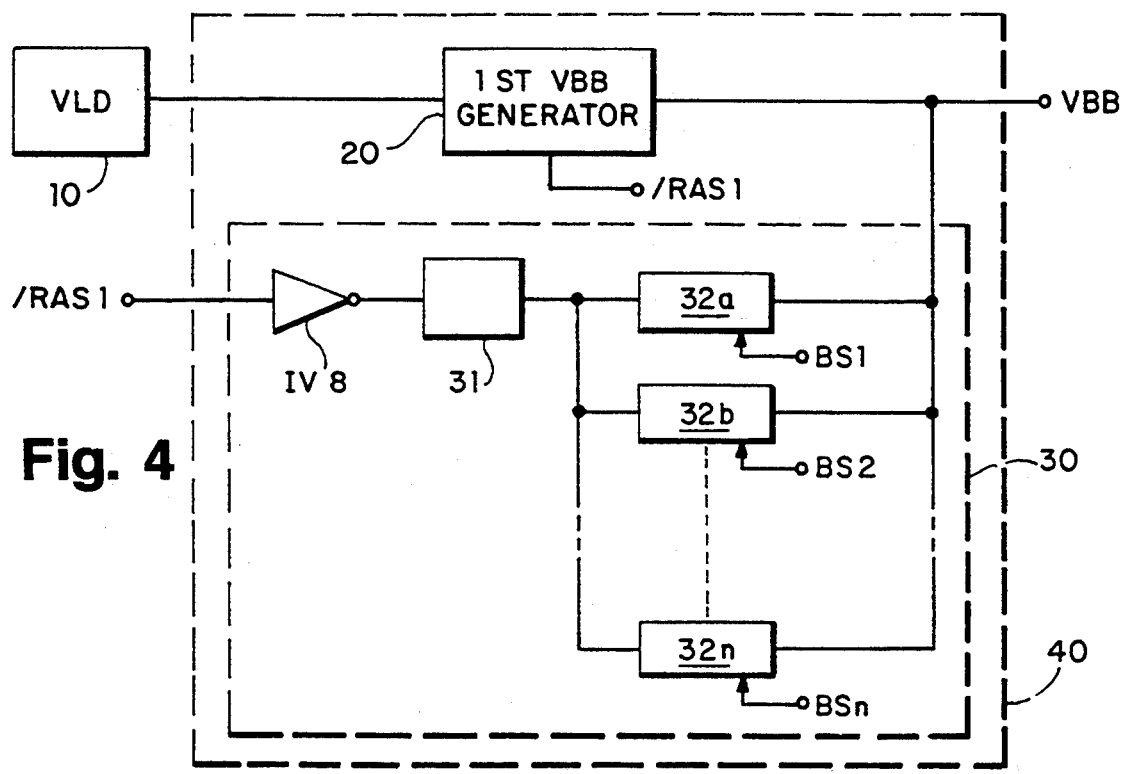
FIG. 4 is a block diagram of a back bias voltage generator circuit according to the present invention.
Figure 5:
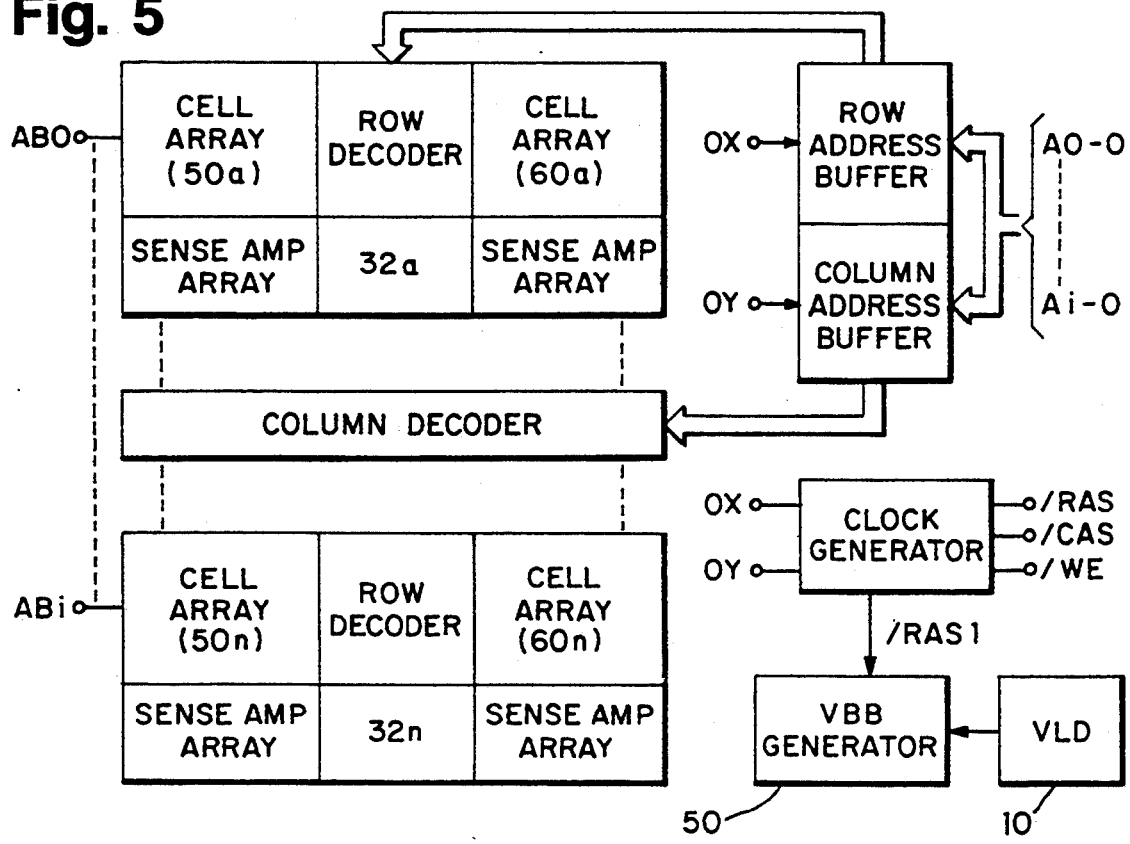
FIG. 5 is an arrangement diagram of a back bias generator circuit according to the present invention.

FIG. 4 is a block diagram of a Vbb generator circuit according to the present invention. As shown in FIG. 4, a back bias voltage generator circuit of the semiconductor memory device comprises first Vbb generator 20, which is connected to VLD section 10 and Vbb and which is controlled by the /RAS1 signal; and second Vbb generator 30 which is controlled by block selection signals BS1-BSn and connected to Vbb and which includes distributed Vbb generators 32a-32n. Distributed Vbb generators 32a-32n are respectively located between memory cell array blocks 50a-60n as shown in FIG. 5.

Figure 6:
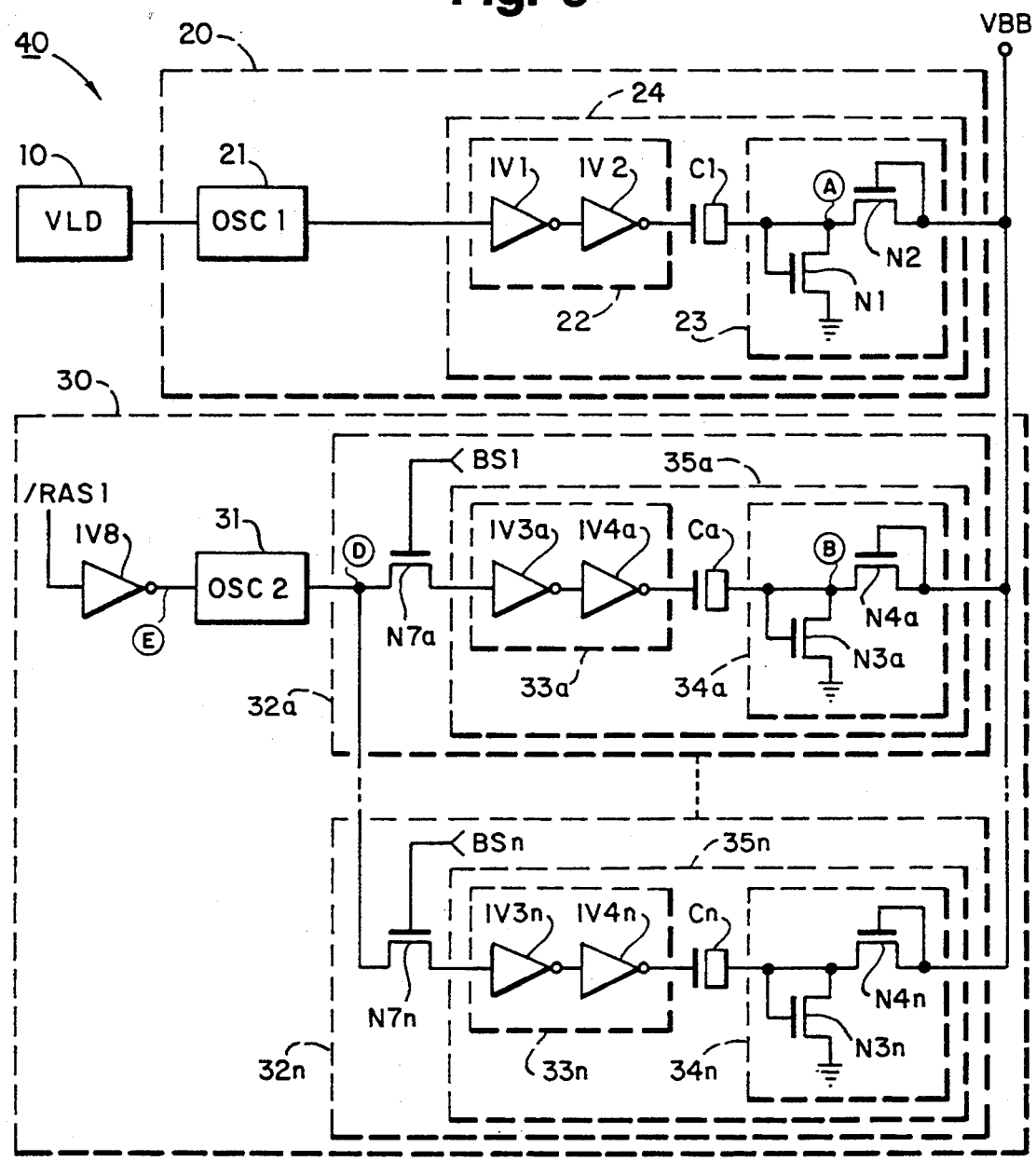
FIG. 6 is a detailed diagram of a back bias generator circuit of a semiconductor memory device according to the present invention.

FIG. 6 is a detailed circuit diagram of Vbb generator circuit 40, comprising first oscillator 21, which is connected to the output stage of VLD section 10, pumping portion 24 connected to the output stage of first oscillator 21 having buffer portion 22, which buffers the oscillating signal of first oscillator 21 and is composed of invertors IV1 and IV2, pumping capacitor C1, and rectifying portion 23 which comprises diodes N1 and N2 and applies the negative voltage to Vbb in cooperation with capacitor C1.

Second Vbb generator 30 comprises second oscillator 31 which is controlled by the output signal of invertor IV8 which inverts the /RAS1 signal, and distributed Vbb generators 32a-32n which are connected in parallel between the output stage of second oscillator 31 and Vbb.

Further, each of distributed Vbb generators 32a-32N has a switching means for transferring a clock pulse, which respectively are constituted with transistors N7a-N7n connected to the output stage of second oscillator 31 and which transmit or intercept the oscillating signal by block selection signals BS1-Bsn; and auxiliary pumping portions 35a-35n having the same constitution as pumping portion 24 of first Vbb generator 20 connected to the outputs of transistors N7a-N7n.

Auxiliary pumping portions 35a-35n each comprise a buffer portion 33a-33n which buffer the output signal of second oscillator 31; capacitors Ca-Cn respectively connected to the output side of buffers 33a-33n and having a function of pumping capacitors; and rectifying portions 34a-34n respectively connected to one electrode of capacitors Ca-Cn and applying the negative voltage to Vbb and including diodes N3a-N4n.

Figure 7:
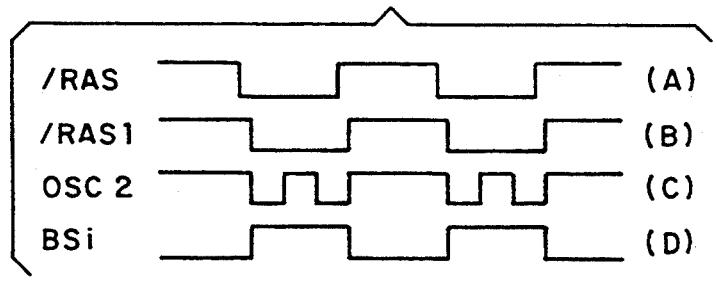
FIG. 7 illustrates wave forms of signals /RAS, /RAS1, OSC2 and BSi.

FIG. 7 illustrates wave forms of signals /RAS, /RAS1, OSC2 and BSi.

First Vbb generator 20 applies the negative voltage to Vbb by capacitor Cl of pumping portion 24 by operating first oscillator 21 before the Vbb voltage is $-3$ Vth as explained in the Background of the Invention. If the Vbb voltage becomes below $-3$ Vth, the phase of the signal from VLD section 10 changes so that the circuit operation of first oscillator 21 stops and the negative voltage is not further provided to Vbb.

Meanwhile, if the chip is active, the /RAS signal reaches a "low" level as in FIG. 7(A), the signal /RAS1, which is delayed from the /RAS signal, occurs. The /RAS1 signal is inverted to a "high" level by invertor IV8 of second Vbb generator 30 and transmitted to second oscillator 31, and thereby second oscillator 31 operates and its oscillating signal is applied to distributed Vbb generators 32a–32n.

At this time, if any one or more of the memory cell arrays is selected, then respective ones of block signals BS1-BSn is selectively "high" as in FIG. 7(D), wherein one or more transistors of transistors N7a–N7n of distributed Vbb generators 32a–32n is /are selectively turned-on, and the signal of second oscillator 31 is provided in auxiliary pumping portion(s) 35a–35n of the selected memory cell array block(s).

For example, if it is supposed that the block selecting signal BS1 in FIG. 6 is at a "high" level, as transistor N7a of distributed Vbb generator 32a is turned-on, second oscillator 31 operates while the /RAS1 signal is at a "low" level as shown in FIG. 7(C), thereby transmitting the output signal of the second oscillator 31 and generating the predetermined periodic pulses into auxiliary pumping portion 35a through transistor N7a.

After the output signal of second oscillator 31 passing through transistor N7a has been buffered through invertors IV3a and IV4a, the negative voltage is applied to Vbb through capacitor Ca of the pumping capacitors.

That is, if the block selection signal BS1 is at a level and output node "D" of second oscillator 31 is at a level as shown in FIG. (C), the "high" level is applied to one electrode of capacitor Ca through invertors IV3a and IV4a, and therefore, by a coupling effect of the pumping capacitor, node "B" is high so that diode N3a is on, and diode N4a is applied with a backward voltage and is off, thereby making the node "B" as the ground voltage.

After this output node "D" of second oscillator 31 is at "low" level, the "low" level is applied to an electrode of capacitor Ca through invertors IV3a and IV4a. Subsequently, node "B" has a negative voltage (lower than the ground level) and diode N3a is off with the backward bias. Since node "B" might become a lower voltage than the Vbb, other diode N4a is turned-on in a forward direction, thereby applying the negative voltage to Vbb.

When the memory cell array block 50a-60a is not selected and the /RAS signal rises to a "high" level, since the /RAS1 signal, which is delayed from the /RAS signal, is at a "high" level, it is inverted to a "low" level by invertor IV8 and is applied to second oscillator 31. Then, operation of second oscillator 31 is stopped and block selecting signal BS1 goes to a "low" level, thereby causing transistor N7a of distributed Vbb generator 32a to be off and stopping the pumping operation of capacitor Ca of auxiliary pumping portion 35a.

In case that other memory cell arrays 50b–50n/60b–60n are selectively active with the same operations described above, the respective block selecting signal BS2-BSn also is at a level so that the corresponding distributed Vbb generator 32b–32n is driven, thereby reducing the consumption of electricity.

As described in detail above, the Vbb generator and capacitance increase as the memory capacity of the semiconductor memory device has increased. If a block of the array located farthest from the Vbb generator is selected, since it is relatively far from the Vbb generator, the Vbb voltage of the farthest array block might rise due to a delay in transmitting the Vbb voltage, which may thereby result in an erroneous operation of the array block. With respect to this point, the present invention can solve the problem of degrading the reliability of the semiconductor memory device. In case that the farthest memory cell array block operates in the Vbb generator, it is possible to control the Vbb voltage from rising only by operating the adjacent distributed Vbb generator, so that safe operation is possible and consumption of electricity can be remarkably reduce.

Although various preferred embodiments of the present invention have been disclosed for illustrative purposes, those skilled in the art will appreciate that various modifications, additions and /or substitutions are possible without departing from the scope and spirit of the present invention as disclosed in the claims.

What is claimed is:

1. A back bias voltage generator circuit of a semiconductor memory device having a first Vbb generator and a second Vbb generator for supplying a back bias voltage to a substrate, the memory device having memory cell array blocks controlled by memory cell array block selecting signals, wherein the second Vbb generator comprises:

an oscillator for generating a clock pulse; and a plurality of distributed Vbb generators, the distributed Vbb generators being located respectively adjacent to memory cell array blocks and receiving a clock pulse from the oscillator, the distributed Vbb generators being activated in accordance with one or more memory cell array block selecting signals.

2. A back bias voltage generator circuit of a semiconductor memory device as claimed in claim 1, wherein the distributed Vbb generators comprise:

an auxiliary pumping portion including a buffer portion for buffering the clock pulse received from the oscillator, a pumping capacitor connected to the output of the buffer portion for pumping a back bias voltage, and a rectifying portion connected to the pumping capacitor for supplying the back bias voltage to the substrate; and a switching means for selectably connecting the clock pulse from the oscillator to the auxiliary pumping portion, the clock pulse activating a pumping operation of the auxiliary pumping portion.

3. A back bias voltage generator circuit of a semiconductor memory device as claimed in claim 1, wherein the oscillator is activated by a row address strobe signal.

4. A back bias voltage generator circuit of a semiconductor memory device as claimed in claim 2, wherein the switching means is a MOSFET.

5. A back bias voltage generator circuit of a semiconductor memory device as claimed in claim 2, wherein the switching means is an n-channel MOSFET.

6. A back bias voltage generator circuit of a semiconductor memory device as claimed in claim 2, wherein the buffer portion comprises one or more invertors.

7. A back bias voltage generator circuit of a semiconductor memory device as claimed in claim 2, wherein the rectifying portion comprises at least two diodes.

8. A back bias voltage generator circuit of a semiconductor memory device as claimed in claim 1, wherein the distributed Vbb generators are located between memory cell array blocks.

9. A back bias voltage generator circuit of a semiconductor memory device as claimed in claim 8, wherein the distributed Vbb generators are located beside row decoders respectively positioned between memory cell array blocks.

10. A semiconductor memory device comprising:
   a plurality of memory cell arrays formed on a substrate;
   a first back bias voltage generating circuit for applying a back bias voltage to the substrate;
   means for receiving memory array selecting signals, the memory array selecting signals causing the memory device to operate selected memory cell arrays;
   an oscillator for generating clock pulses;
   a plurality of second back bias voltage generating circuits for applying a back bias voltage to the substrate, the second back bias voltage generating circuits being positioned correspondingly with the memory cell arrays and activated in response to one or more of the memory array selecting signals.

11. A semiconductor memory device as claimed in claim 10, wherein the second back bias generating circuits are located between memory cell arrays.

12. A semiconductor memory device as claimed in claim 10, further comprising row decoders coupled to the memory cell arrays, wherein the second back bias generating circuits are located beside row decoders respectively positioned between memory cell arrays.

13. A method for generating back bias voltages in a semiconductor memory device formed in a substrate and having a plurality of memory cell arrays selected by memory cell array selecting signals, comprising:
   generating a first memory cell array selecting signal for selecting a first memory cell array;
   activating a first back bias generating circuit positioned correspondingly to the first memory cell array in accordance with the first memory cell array selecting signal, the first back bias generating circuit providing a back bias voltage to the substrate;
   generating a second memory cell array selecting signal for selecting a second memory cell array; and
   activating a second back bias generating circuit positioned correspondingly to the second memory cell array in accordance with the second memory cell array selecting signal, the second back bias generating circuit providing a back bias voltage to the substrate.

14. The method of claim 13, further comprising:
   detecting whether the substrate back bias voltage has exceeded a predetermined threshold voltage level; and
   selectively activating a third back bias voltage generating circuit depending upon whether the substrate back bias voltage has exceeded the predetermined threshold voltage level.

* * * * *